(12) United States Patent
Yamamoto et al.

(10) Patent No.: US 10,629,147 B2
(45) Date of Patent: Apr. 21, 2020

(54) DISPLAY DEVICE

(71) Applicant: SHARP KABUSHIKI KAISHA, Sakai, Osaka (JP)

(72) Inventors: Kaoru Yamamoto, Sakai (JP); Kohhei Tanaka, Sakai (JP); Tokihiro Yokono, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 16/127,706

(22) Filed: Sep. 11, 2018

(65) Prior Publication Data
US 2019/0080658 A1 Mar. 14, 2019

(30) Foreign Application Priority Data
Sep. 11, 2017 (JP) ................................. 2017-174028

(51) Int. Cl.
*G09G 3/36* (2006.01)
*G06F 3/041* (2006.01)
(Continued)

(52) U.S. Cl.
CPC ......... *G09G 3/3648* (2013.01); *G02F 1/1368* (2013.01); *G02F 1/136286* (2013.01);
(Continued)

(58) Field of Classification Search
CPC .. G09G 3/3266; G09G 3/3674; G09G 3/3677; G09G 2310/0286; G09G 2310/02;
(Continued)

(56) References Cited

U.S. PATENT DOCUMENTS 9,620,078 B2 * 4/2017 Hong ...................... G06F 3/041
9,690,419 B2 * 6/2017 Zhang .................... G11C 19/28
(Continued)

FOREIGN PATENT DOCUMENTS

JP 2014-182203 A 9/2014
JP 2015-122057 A 7/2015

*Primary Examiner* — Koosha Sharifi-Tafreshi
(74) *Attorney, Agent, or Firm* — ScienBiziP, P.C.

(57) ABSTRACT

Provided is a technique of causing less display irregularities to occur when the scanning of the gate lines is resumed in a display device in which the scanning of gate lines is performed intermittently.
A display device includes a display panel, and a driving circuitry that includes a plurality of drive circuits for scanning gate lines. The driving circuitry alternately switches a scanning period in which the gate lines are scanned, and a non-scanning period in which the scanning of the gate lines is suspended, during one vertical scanning period, according to a control signal. Each driving circuit $301n$ includes a first switching element N that applies a selection voltage to the gate line; an internal line netA; a second switching element A that charges the internal line netA to a first potential; and a third switching element B that includes a drain electrode connected to the internal line netA, and a source electrode having a second potential that is lower than the first potential. a drive circuit corresponding one of the gate lines that is selected at start of the scanning period includes a charging circuit $301b(n)$ which recharges the internal line netA of this drive circuit to a potential equal to or higher than the first potential, before the start of this scanning period.

12 Claims, 13 Drawing Sheets

(51) Int. Cl.
*G06F 3/044* (2006.01)
*G02F 1/1362* (2006.01)
*H01L 27/12* (2006.01)
*G02F 1/1368* (2006.01)
*G11C 19/28* (2006.01)
*G11C 19/18* (2006.01)

(52) U.S. Cl.
CPC ............ *G06F 3/044* (2013.01); *G06F 3/0412* (2013.01); *G06F 3/0416* (2013.01); *G09G 3/3677* (2013.01); *G11C 19/184* (2013.01); *G11C 19/28* (2013.01); *G11C 19/287* (2013.01); *H01L 27/124* (2013.01); *H01L 27/1225* (2013.01); *G09G 2300/0426* (2013.01); *G09G 2310/0286* (2013.01); *G09G 2310/08* (2013.01); *G09G 2354/00* (2013.01)

(58) Field of Classification Search
CPC ... G09G 2310/0202; G09G 2310/0208; G09G 2310/0205; G06F 3/041; G06F 3/0412; G06F 3/041661; G06F 3/0416; G06F 3/044; G06F 3/04184
USPC .......................................... 345/100, 173, 174
See application file for complete search history.

(56) References Cited

U.S. PATENT DOCUMENTS

| | | |
|---|---|---|
| 2014/0267156 A1 | 9/2014 | Koga et al. |
| 2015/0177880 A1 | 6/2015 | Shin et al. |
| 2015/0243678 A1* | 8/2015 | Umezaki ................ G11C 19/28 257/43 |
| 2016/0224175 A1* | 8/2016 | Moon ................... G06F 3/0412 |

* cited by examiner

DISPLAY DEVICE

TECHNICAL FIELD

The present invention relates to a display device.

BACKGROUND ART

Patent Document 1 indicated below discloses a touch screen panel integrated display device that includes a panel that serves as both of a display and a touch screen. On the panel, a plurality of pixels are formed, and each pixel is provided with a pixel electrode, and a transistor connected to the pixel electrode. Further, on the panel, a plurality of electrodes are arranged with spaces therebetween. The electrodes function as common electrodes that form lateral electric fields (horizontal electric fields) among the pixel electrodes in the display driving mode, and function as touch electrodes that form electrostatic capacitances between the same and a finger or the like in the touch driving mode. At least one signal line, approximately parallel with data lines, is connected to each of the plurality of electrodes, so that a touch driving signal or a common voltage signal is supplied thereto via the signal line.

PRIOR ART DOCUMENT

Patent Document

Patent Document 1: JP-A-2015-122057

SUMMARY OF THE INVENTION

Problem to be Solved by the Invention

In the touch screen panel integrated display device as described above, since the display driving mode and the touch driving mode are performed alternately during one frame period, the scanning of the gate lines by shift registers is suspended in the touch driving mode. In other words, such a display device scans the gate lines intermittently. The shift registers therein respectively hold predetermined potentials for scanning the gate lines before scanning the gate lines. In the suspension period, decreasing of the potential within a shift register corresponding to the gate line to be scanned when the display driving mode is resumed, the gate line cannot be appropriately scanned, resulting in that display irregularities occur.

It is an object of the present invention to provide a technique of causing less display irregularities to occur when the scanning of the gate lines is resumed in a display device in which the scanning of gate lines is performed intermittently.

Means to Solve the Problem

A display device in one embodiment of the present invention includes: a display panel having a plurality of gate lines; and driving circuitry that includes a plurality of drive circuits that are provided in correspondence to the gate lines, respectively, so as to scan the gate lines sequentially, wherein the driving circuitry alternately switches a scanning period in which the gate lines are scanned, and a non-scanning period in which the scanning of the gate lines is suspended, during one vertical scanning period, according to a control signal input to the driving circuitry, wherein each of the drive circuits includes: a first switching element that applies a selection voltage to a corresponding one of the gate lines, the selection voltage being a voltage for causing the corresponding gate line to be switched to a selected state; an internal line connected with a gate electrode of the first switching element; a second switching element that is connected to the internal line, the second switching element charging the internal line to a first potential before the corresponding gate line is switched to the selected state; and a third switching element that includes a drain electrode connected to the internal line, and a source electrode having a second potential that is lower than the first potential, the third switching element pulling down the potential of the internal line to a level of the potential of the second line when the corresponding gate line is in a non-selected state, wherein one of the plurality of drive circuits corresponding one of the gate lines that is selected at start of the scanning period, includes a charging circuit which recharges the internal line of this drive circuit to at least a potential at the same level as that of the first potential, before the start of this scanning period.

Effect of the Invention

The present invention makes it possible that less display irregularities to occur when the scanning of the gate lines is resumed in a display device in which the scanning of gate lines is performed intermittently.

MODE FOR CARRYING OUT THE INVENTION

Figure 1:
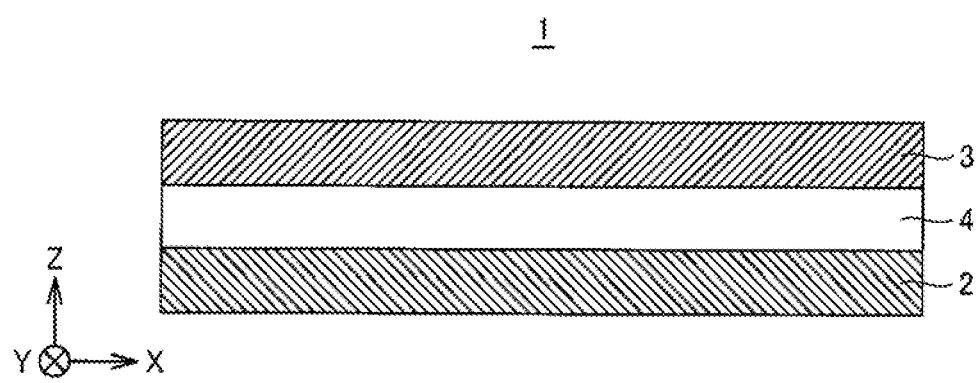
FIG. 1 is a schematic cross-sectional view of a display device in Embodiment 1.

A display device in one embodiment of the present invention includes: a display panel having a plurality of gate lines; and driving circuitry that includes a plurality of drive circuits that are provided in correspondence to the gate lines, respectively, so as to scan the gate lines sequentially, wherein the driving circuitry alternately switches a scanning period in which the gate lines are scanned, and a non-scanning period in which the scanning of the gate lines is suspended, during one vertical scanning period, according to a control signal input to the driving circuitry, wherein each of the drive circuits includes: a first switching element that applies a selection voltage to a corresponding one of the gate lines, the selection voltage being a voltage for causing the corresponding gate line to be switched to a selected state; an internal line connected with a gate electrode of the first switching element; a second switching element that is connected to the internal line, the second switching element charging the internal line to a first potential before the corresponding gate line is switched to the selected state; and a third switching element that includes a drain electrode connected to the internal line, and a source electrode having a second potential that is lower than the first potential, the third switching element pulling down the potential of the internal line to a level of the potential of the second line when the corresponding gate line is in a non-selected state, wherein one of the plurality of drive circuits corresponding one of the gate lines that is selected at start of the scanning period, includes a charging circuit which recharges the internal line of this drive circuit to at least a potential at the same level as that of the first potential, before the start of this scanning period (the first configuration).

According to the first configuration, the source electrode of the third switching element has the second potential lower than the first potential. In the display device that has the scanning period for the scanning of the gate lines and the non-scanning period, therefore, if leakage current occurs to the third switching element during the non-scanning period in the drive circuit whose gate line scanning operation is suspended in a state where the internal line is charged so as to have the first potential, the potential of the internal line thus charged decreases. Before the scanning period is resumed, however, this internal line is recharged by the charging circuit so that the internal line has at least a potential at the same level as that of the first potential. Accordingly, as compared with a case where the charging circuit is not provided, the first switching element of the drive circuit of the gate line to be selected when the scanning period is resumed can be appropriately switched to the ON state, whereby the foregoing gate line can be surely switched to the selected state.

The first configuration may be further characterized in that the charging circuit recharges the internal line after start of the non-scanning period, before end of the non-scanning period (the second configuration). With the second configuration, after the start of the non-scanning period, the internal line, whose potential decreases due to leakage current, can be recharged before the end of the non-scanning period. This makes it possible to appropriately switch the gate line to be selected when the scanning period is resumed to the selected state.

The first configuration may be further characterized in that the charging circuit charges the internal line to a certain potential lower than the first potential after start of the non-scanning period, and recharges the internal line to a potential higher than the first potential before the start of the scanning period (the third configuration).

According to the third configuration, after the start of the non-scanning period, the internal line, whose potential decreases due to leakage current, is charged so as to have a certain potential lower than the first potential, and is recharged so as to have a potential higher than the first potential before the resumption of the scanning period. Accordingly, the potential of the internal line does not become lower than a certain potential, and when the scanning period is resumed, the gate line to be selected can be appropriately switched to the selected state.

Any one of the first to third configurations may be further characterized in that the charging circuit includes: a first charging switching element that is connected with the internal line, and recharges the internal line; a charging internal line that is connected with a gate electrode of the first charging switching element; a second charging switching element that charges the charging internal line when the internal line is charged to the first potential; and a capacitor that is connected to the charging internal line, wherein the first charging switching element includes a source electrode that is connected with the internal line, a gate electrode that is connected with the charging internal line, and a drain electrode to which a potential equal to or higher than the first potential is supplied, and when the internal line is recharged by the first charging switching element, the charging internal line is charged, via the capacitor, to a potential higher than that when being charged by the second charging switching element (the fourth configuration).

According to the fourth configuration, when the internal line is recharged, the charging internal line has a potential higher than that when it is charged by the second charging switching element. Accordingly, the first charging switching element can be surely switched to the ON state before the resumption of the scanning period.

The fourth configuration may be further characterized in that the charging circuit further includes a third charging switching element that is connected with the charging internal line, the capacitor, and the first charging switching element, wherein the first charging switching element is connected with the charging internal line via the capacitor; in the third charging switching element, a gate electrode thereof is connected with the charging internal line, a source electrode thereof is connected with the gate electrode of the first charging switching element and the capacitor, and a potential of a drain electrode thereof is changed to a potential equal to or higher than the first potential before the start of the scanning period; and the capacitor has a pair of electrodes, one of the electrodes is connected with the charging internal line, and the other electrode is connected with the gate electrode of the first charging switching element, and the source electrode of the third charging switching element (the fifth configuration).

According to the fifth configuration, before the resumption of the scanning period, the potential of the drain electrode of the third charging switching element is input to the charging internal line via the capacitor. Accordingly, the potential of the charging internal line becomes higher than that when being charged by the second charging switching element. At this time, since a high voltage is applied by the gate electrode of the third charging switching element, it is possible to surely switch the first charging switching element into the ON state via the third charging switching element, and recharge the internal line to an appropriate potential.

The fourth or fifth configuration may be further characterized in that the charging circuit further includes a fourth charging switching element that has a source electrode connected to the charging internal line, and a drain electrode whose potential is changed to be equal to higher than the first potential during the non-scanning period (the sixth configuration).

With the sixth configuration, the charging potential of the charging internal line charged by the second charging switching element can be prevented from decreasing during the non-scanning period.

The fourth configuration may be further characterized in that the capacitor has a pair of electrodes, one of the electrodes is connected with the charging internal line, and before the start of the scanning period, a potential equal to or higher than the first potential is supplied to the other electrode (the seventh configuration).

According to the seventh configuration, before the resumption of the scanning period, a potential equal to or higher than the first potential is input to the charging internal line via the capacitor. The potential of the charging internal line, therefore, becomes higher than the potential of the charging by the second charging switching element. At this time, since a further higher voltage is applied to the gate electrode of the third charging switching element, the first charging switching element can be surely switched to the ON state via the third charging switching element, and the internal line can be charged so as to have an appropriate potential.

The fourth or seventh configuration may be further characterized in that the charging circuit further includes a fifth charging switching element that is connected to the charging internal line, and pulls down the potential of the charging internal line to the second potential or lower, every vertical scanning period (the eighth configuration).

With the eighth configuration, the potential of charging internal line can be controlled so as to be equal to or lower than the second potential every vertical scanning period. This makes it possible to initialize the charging circuit every vertical scanning period.

Any one of the fourth to sixth configurations may be further characterized in that the charging circuit further includes a fifth charging switching element that is connected to the charging internal line, and pulls down the potential of the charging internal line to the second potential or lower, every vertical scanning period (the ninth configuration).

According to the ninth configuration, the potential of the charging internal line is controlled so as to be equal to or lower than the second potential every vertical scanning period. This makes it possible to initialize the charging circuit every vertical scanning period.

Any one of the fourth to ninth configurations may be further characterized in that a threshold voltage of the first charging switching element, and a threshold voltage of the second switching element, are equal to each other (the tenth configuration). According to the tenth configuration, the threshold voltage of the first charging switching element and the threshold voltage of the second switching element are equal to each other. Accordingly, when the first charging switching element is in the ON state, the internal line can be recharged so as to have a potential equal to the first potential.

Any one of the first to tenth configurations may be further characterized in that the switching element used in the drive circuits and the charging circuit includes a semiconductor layer that is formed with oxide semiconductor (the eleventh configuration). With the eleventh configuration, leakage current of the switching element hardly occurs, as compared with the case where amorphous silicon is used.

The eleventh configuration may be further characterized in that the oxide semiconductor contains indium, gallium, zinc, and oxygen (the twelfth configuration). With the twelfth configuration, the switching element has higher electronic mobility, and leakage current hardly occurs, as compared with a case where amorphous silicon is used.

The eleventh or twelfth configuration may be further characterized in that the oxide semiconductor includes a crystalline part (the thirteenth configuration)

The following description describes embodiments of the present invention in detail, while referring to the drawings. Identical or equivalent parts in the drawings are denoted by the same reference numerals, and the descriptions of the same are not repeated. To make the description easy to understand, in the drawings referred to hereinafter, the configurations are simply illustrated or schematically illustrated, or the illustration of a part of constituent members is omitted. Further, the dimension ratios of the constituent members illustrated in the drawings do not necessarily indicate the real dimension ratios.

Embodiment 1

FIG. 1 is a schematic cross-sectional view of a display device in the present embodiment. The display device 1 in the present embodiment includes an active matrix substrate 2, a counter substrate 3, and a liquid crystal layer 4 interposed between the active matrix substrate 2 and the counter substrate 3. Each of the active matrix substrate 2 and the counter substrate 3 includes a glass substrate that is substantially transparent (having high translucency). Further, though the illustration is omitted, the display device 1 includes a backlight that is provided so as to extend in a surface direction of the active matrix substrate 2, on a side opposite to the liquid crystal layer 4, and a pair of polarizing plates between which the active matrix substrate 2 and the counter substrate 3 are interposed. Thought the illustration is omitted, the counter substrate 3 includes color filters of three colors of red (R), green (G), and blue (B).

The display device 1 has a function of displaying an image, and at the same time, a function of detecting a position at which a user has touched (a touch position), on the image displayed. This display device 1 is a so-called in-cell type touch panel display device wherein elements necessary for detecting a touch position is provided on the active matrix substrate 2.

Further, in the display device 1, the method for driving liquid crystal molecules contained in the liquid crystal layer 4 is the horizontal electric field driving method. To realize the horizontal electric field driving method, pixel electrodes and counter electrodes (common electrodes) for forming electric fields are formed on the active matrix substrate 2. The following description describes the configuration of the active matrix substrate 2 more specifically.

Figure 2A:
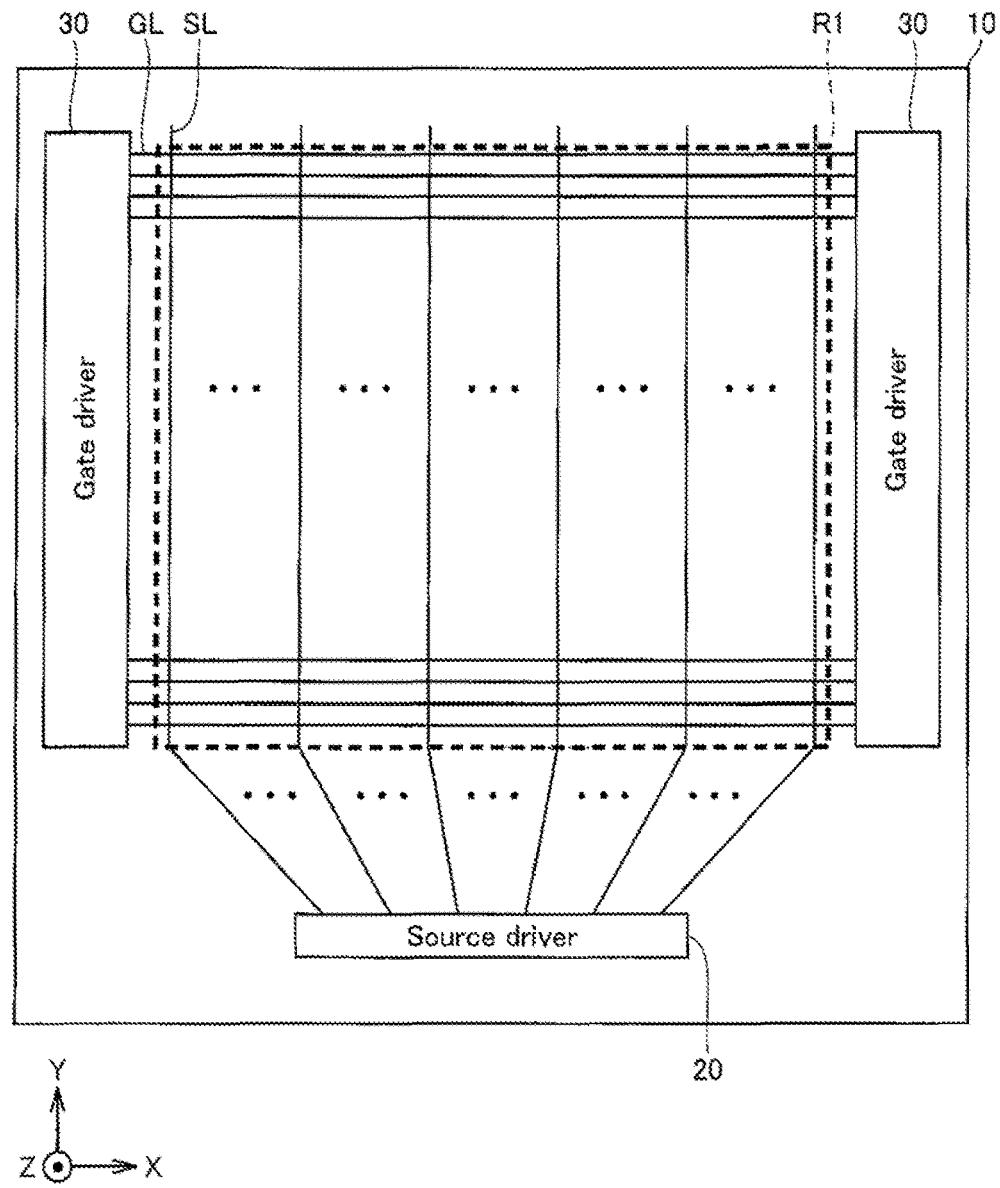
FIG. 2A is a plan view illustrating a schematic configuration of an active matrix substrate illustrated in FIG. 1.

FIG. 2A is a plan view illustrating a schematic configuration of the active matrix substrate 2. As illustrated in FIG. 2A, the active matrix substrate 2 includes a plurality of gate lines GL, a plurality of source lines SL, a source driver 20, and gate drivers 30.

Though the illustration is omitted in this drawing, on the active matrix substrate 2, pixel electrodes are provided in areas defined by the gate lines GL and the source lines SL, respectively, and pixels are formed therein, respectively. The active matrix substrate 2 has a display area R1 composed of the pixels. Each pixel electrode correspond to any one of the colors R, G, and B of the color filters (not shown) provided on the counter substrate 3.

Figure 2B:
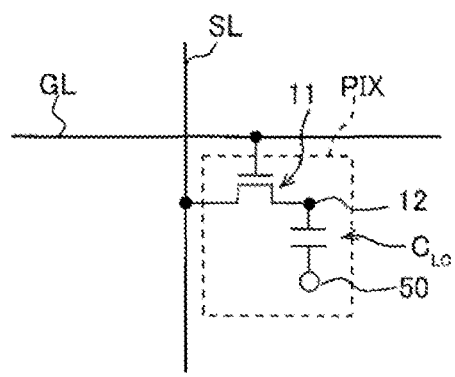
FIG. 2B is an equivalent circuit diagram of one pixel.

FIG. 2B illustrates an equivalent circuit of one pixel. The pixel PIX includes a thin film transistor (TFT) 11, a pixel electrode 12, and a common electrode 50. The gate electrode of the TFT 11 is connected with the gate line GL, the source electrode thereof is connected with the source line SL, and the drain electrode thereof is connected with the pixel electrode 12. A liquid crystal capacitor $C_{LC}$ is formed between the pixel electrode 12 and the counter electrode 50.

As illustrated in FIG. 2A, the source driver 20 and the gate drivers 30 are provided outside the display area R1. Though the illustration is omitted in FIG. 2A, the gate driver 30 have shift registers that are provided so as to correspond to the gate lines GL, respectively. Each shift register is provided in the vicinity of one of ends of each gate line GL. Each shift register applies a predetermined voltage (hereinafter referred to as a selection voltage) to the gate line GL, so as to switch the gate line GL into the selected state. Hereinafter the state in which the gate line GL is selected is referred to as the scanning or the driving of the gate line GL in some cases.

The source driver 20 is provided in a frame region outside the display area R1, on a side of one of ends of the source line SL, and is connected with the source lines SL. The source driver 20 supplies data signals for displaying images to the source lines SL.

Figure 3:
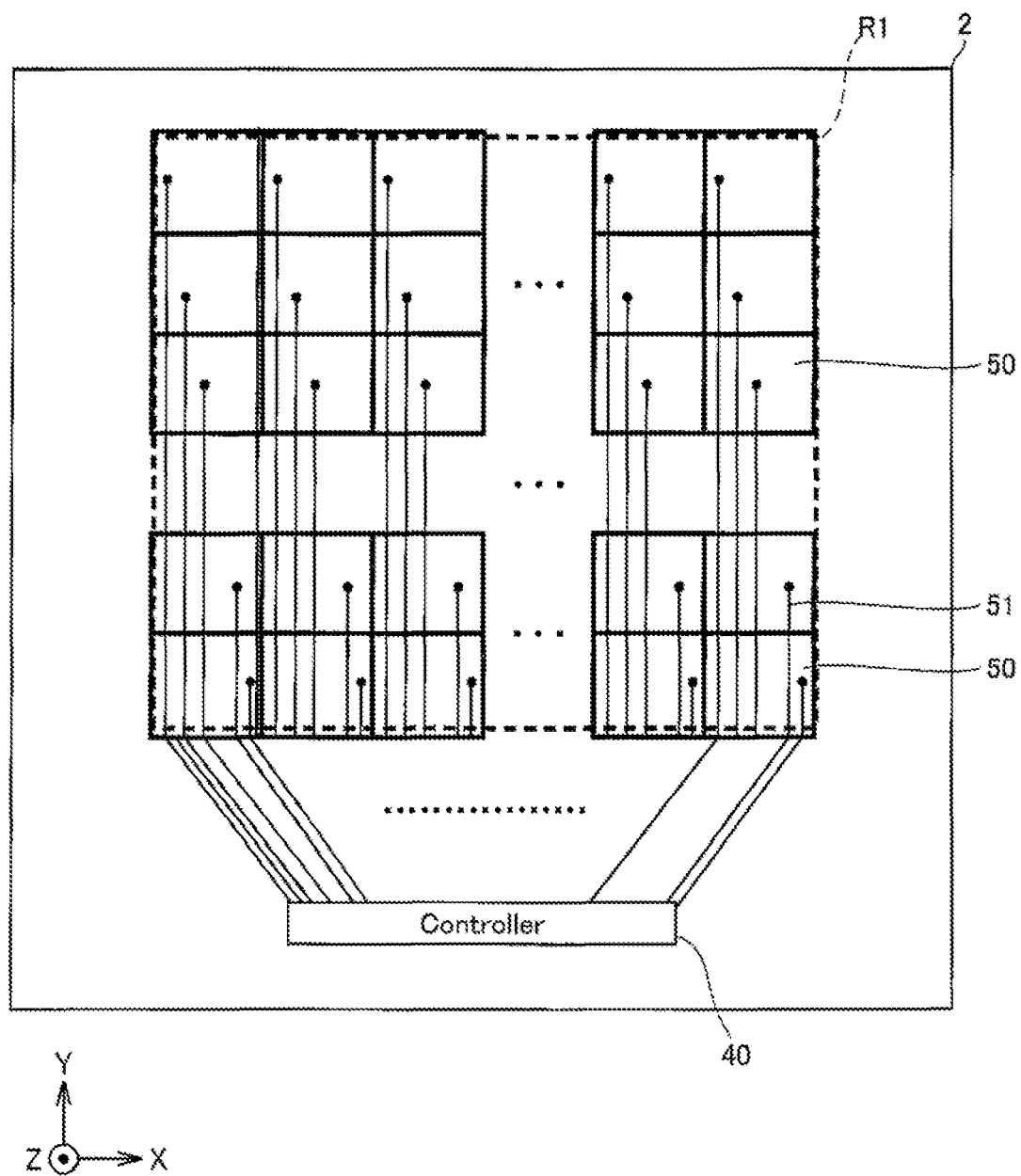
FIG. 3 is a plan view illustrating one exemplary arrangement of counter electrodes formed on the active matrix substrate illustrated in FIG. 2.

FIG. 3 schematically illustrates an exemplary arrangement of the counter electrodes 50 formed on the active matrix substrate 2. As illustrated in FIG. 3, each counter electrode 50 is in a rectangular shape, and a plurality of the same are arranged in matrix on the active matrix substrate 2. The counter electrodes 50 are provided in an upper layer with respect to the pixel electrodes 12, on the liquid crystal layer 4 side surface (see FIG. 1) of the active matrix substrate 2. Each of the counter electrodes 50 is, for example, approximately in a square shape whose side is several millimeters, and is larger than the pixel. Though the illustration is omitted in this drawing, in the counter electrodes 50, slits (having a width of, for example, several µm) are formed for causing horizontal electric fields to be generated between the same and the pixel electrodes 12.

The active matrix substrate 2 includes a controller 40 on a frame region side where the source driver 20 illustrated in FIG. 2 is provided. The controller 40 performs image display control for displaying images, and at the same time, performs touch position detection control for detecting a touch position.

The controller 40 and each counter electrode 50 are connected with each other by a signal line 51 that extends in the Y axis direction. In other words, the signal line 51, the number of which is the same as the number of the counter electrodes 50, are formed on the active matrix substrate 2.

The counter electrodes 50 are used, in pair with the pixel electrodes 12, in the image display control, as well as in the touch position detection control.

Figure 4:
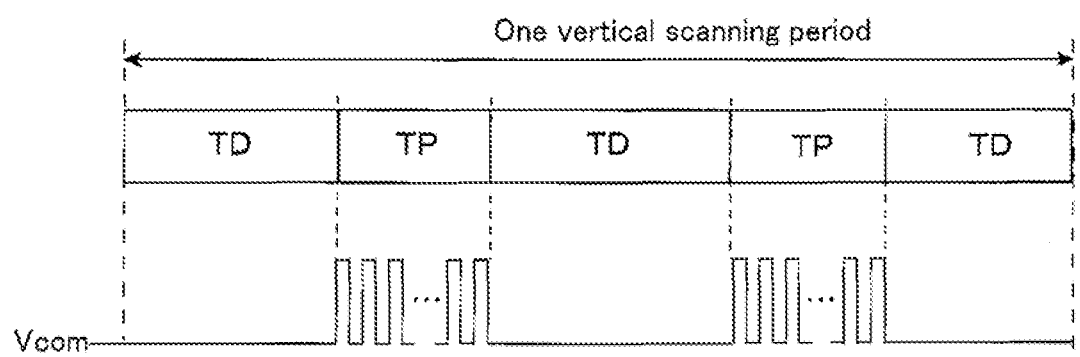
FIG. 4 illustrates voltages of a counter electrode in an image display period TD and a touch position detection period TP during one horizontal scanning period.

In the present embodiment, as illustrated in FIG. 4, an image display period TD and a touch position detection period TP are provided alternately a plurality of times during one vertical scanning period.

The controller 40 supplies a constant direct current signal to the signal lines 51 during the image display period TD, so as to cause the counter electrodes 50 to function as common electrodes. Further, during the touch position detection period TP, the controller 40 supplies an alternate current signal having a constant amplitude to the signal lines 51, as a touch driving signal for the detection of a touch position.

Parasitic capacitances are formed between adjacent ones of the counter electrodes 50 and the like. When a human finger or the like touches the display screen of the display device 10, a capacitor is formed between the counter electrodes 50 and the human finger or the like, whereby the electrostatic capacitance increases. During the touch position detection control, the counter electrodes 50 receive the touch driving signal supplied via the signal lines 51, and output changes in the electrostatic capacitances at positions of the counter electrodes 50, via the signal lines 51 to the controller 40.

The gate driver 30 sequentially scan the gate lines GL during the image display period TD, and suspends the scanning of the gate lines GL during the touch position detection period TP. In other words, the image display period TD is a period for the scanning of the gate lines GL, and the touch position detection period TP is a period for the non-scanning of the gate lines GL.

Figure 5:
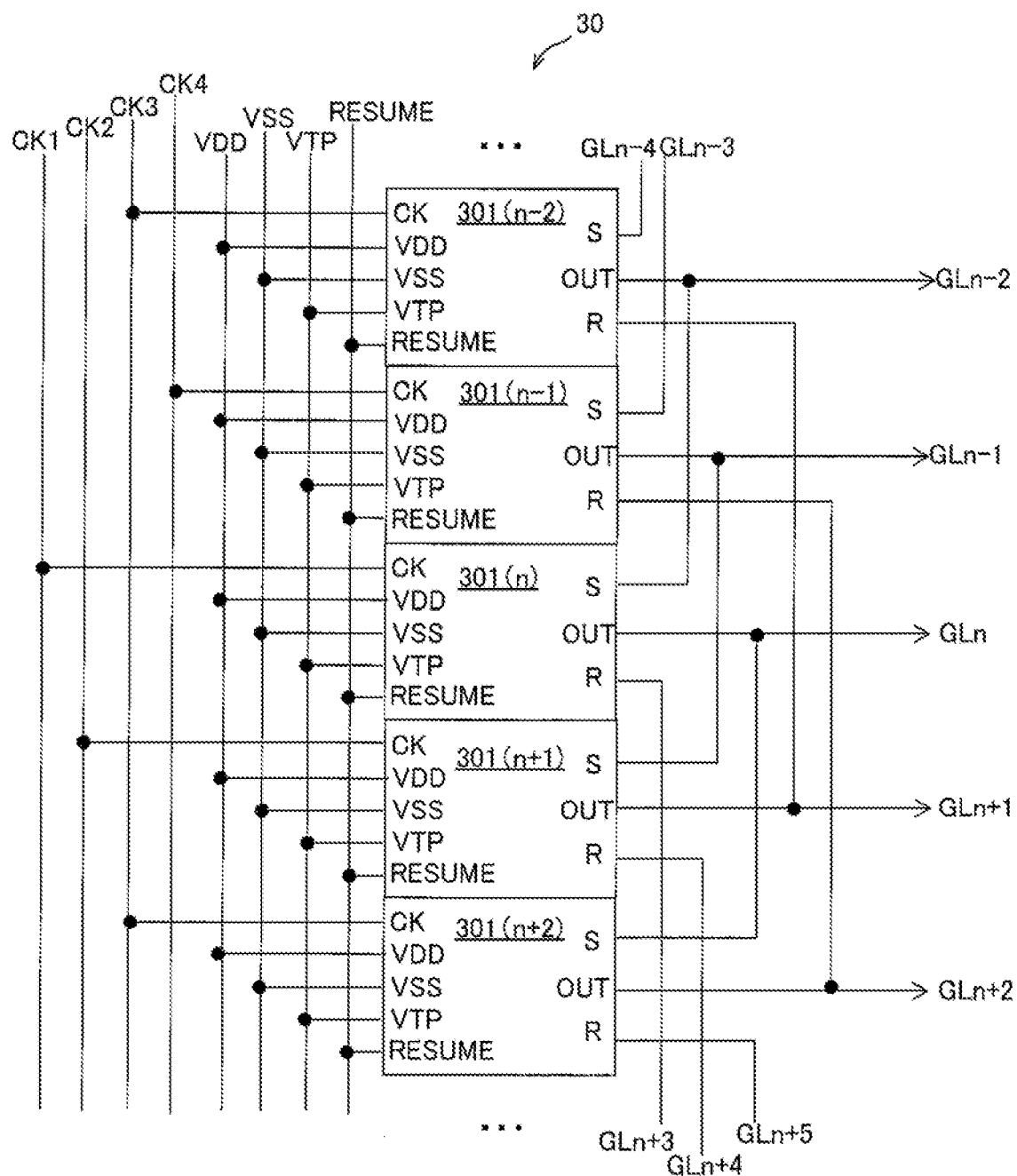
FIG. 5 is a schematic diagram explaining input/output signals of shift registers of the gate driver illustrated in FIG. 2.

Here, the shift registers of the gate driver 30 are described. FIG. 5 illustrates input/output signals for shift registers 301(n−2) to 301(n+2), which are provided so as to correspond to the gate lines GLn−2 to GLn+2, which are the gate lines on the n−2'th to n+2'th stages (n: an integer of 3 or more). Though the illustration is omitted, the shift registers corresponding to the gate lines of the other stages have configurations identical to this. The following description describes the input/output signals for the shift register 301, while referring to the shift register 301n as an example.

As illustrated in FIG. 5, the shift register 301n has terminals (a terminal CK, a terminal VTP, a terminal RESUME, and a terminal VSS) to which control signals (any one of CK1 to CK4, VTP, RESUME) and power source voltage signals (VDD, VSS) are supplied, respectively, by the controller 40 (see FIG. 3).

The shift register 301n further has a terminal S, a terminal R, and a terminal OUT. The terminal S is connected with the gate line GLn−2, which is located at two lines ahead from the gate line GLn that the shift register drives. The terminal R is connected with the gate line GLn+3, which is located at three lines behind from the gate line GLn. The terminal OUT is connected with the gate line GLn. The terminals S of the shift registers 301 for the gate line GL1 and the gate line GL2 are connected with the controller 40 (see FIG. 3), and a set signal is input thereto at predetermined timings.

In this example, the control signals denoted by "CK1" to "CK4" (hereinafter referred to as clock signals) are signals having a potential at a high (H) level and a potential at a low (L) level alternately at every two horizontal scanning periods. The potential at the H level is, for example, the same potential as that of the power source voltage signal VDD, and the potential at the L level is, for example, the same potential as that of the power source voltage signal VSS. The clock signals CK1 and CK3 have phases opposite to each other, and so do the clock signals CK2 and CK4. Further, the phase of the clock signal CK1 is shifted from the phases of the clock signals CK2 and CK4 for one horizontal scanning period each, and the phase of the clock signal CK3 is shifted from the phases of the clock signals CK2 and CK4 for one horizontal scanning period each. In other words, the clock signals CK1 to CK4 are four-phase clock signals having phases shifted from one another.

A control signal denoted by "VTP" (hereinafter referred to as a signal VTR) has the potential at the H level during the touch position detection period TP, that is, the non-scanning period, and has the potential at the L level during the image display period TD, that is, the scanning period.

A control signal denoted by "RESUME" (hereinafter referred to as a signal RESUME) has the potential at the L level during the image display period TD, and has the potential at the H level, for a certain set period before the next image display period TD starts, during the touch position detection period TP.

Figure 6:
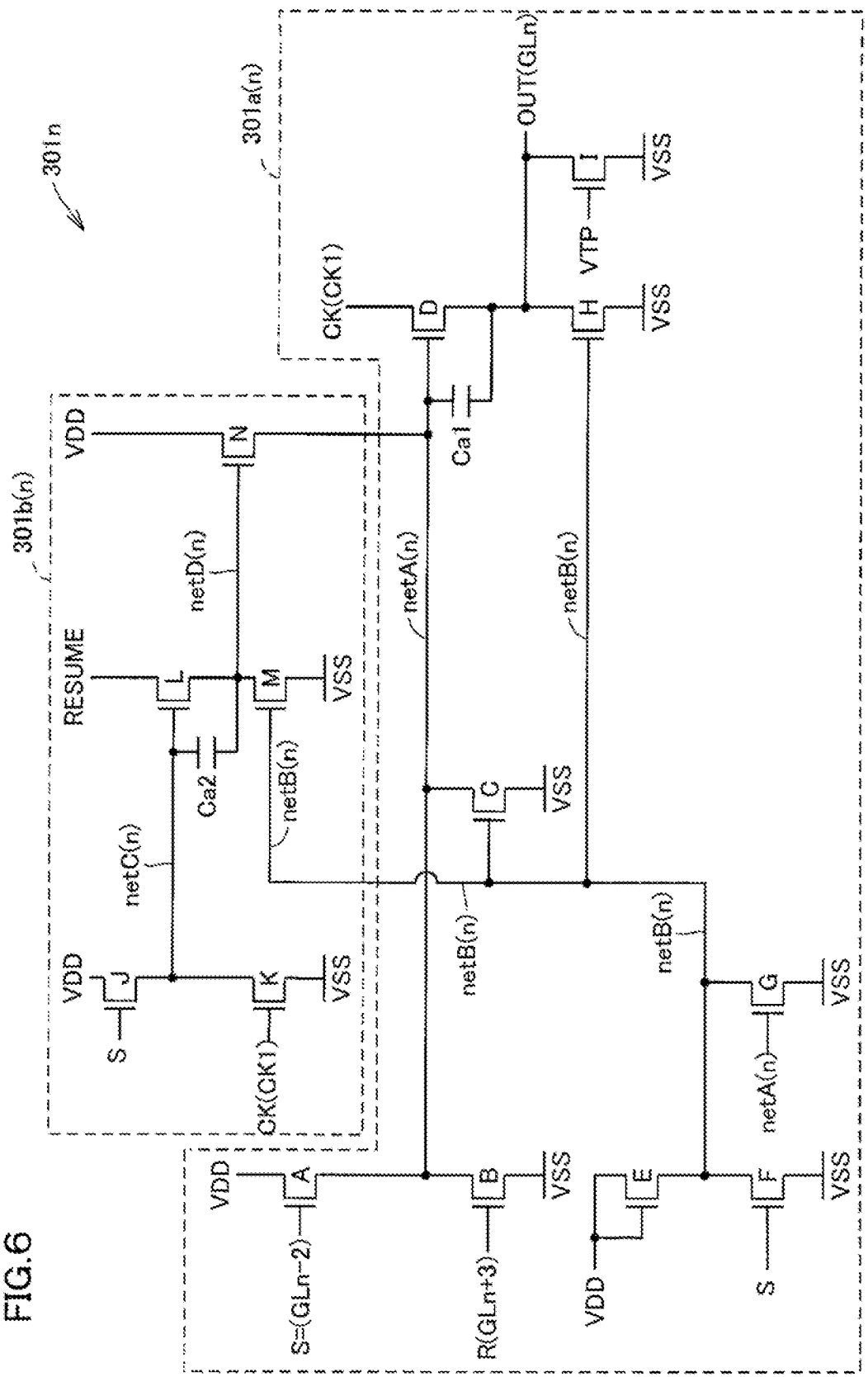
FIG. 6 is an equivalent circuit diagram of the shift register in Embodiment 1.

FIG. 6 illustrates an equivalent circuit of the shift register 301n. As illustrated in FIG. 6, the shift register 301n includes a selection circuit 301a(n) and a charging circuit 301b(n). The selection circuit 301a(n) swiches the gate line GLn into the selected state, and the charging circuit 301b(n) recharges an internal line of the selection circuit 301a(n) again.

The selection circuit 301a(n) is formed by connecting TFTs denoted by "A" to "I" and a capacitor Ca1. The charging circuit 301b(n) is formed by connecting TFTs denoted by "J" to "N" and a capacitor Ca2. Hereinafter the TFTs denoted by "A" to "N" are referred to as TFTs-A to -N.

As illustrated in FIG. 6, the shift register 301n includes internal lines denoted by "netA(n)" to "netD(n)". "netA(n)" connects TFTs-A to -D and the capacitor Ca1 in the selection circuit 301a(n), and TFT-N in the charging circuit 301b(n). "netB(n)" connects TFT-C and TFTs-E to -H in the selection circuit 301a(n), and TFT-M in the charging circuit 301b(n). "netC(n)" i connects TFTs-J to -L and the capacitor Ca2 in the charging circuit 301b(n). Further, "netD(n)" connects TFTs-L to -N and the capacitor Ca2 in the charging circuit 301b(n).

The following description more specifically describes respective constituent members of the selection circuit 301a(n) and the charging circuit 301b(n) of the shift register 301(n).

(Selection Circuit)

Regarding TFT-A, the gate electrode thereof is connected the terminal 5, which is connected with the gate line GLn−2, the drain electrode thereof is connected with the terminal VDD, to which the power source voltage signal VDD is supplied, and the source electrode thereof is connected with netA(n).

Regarding the TFT-B, the gate electrode thereof is connected with the terminal R, which is connected with the gate line GLn+3, the drain electrode thereof is connected with netA(n), and the source electrode thereof is connected with the terminal VSS, to which the power source voltage signal VSS is supplied.

Regarding TFT-C, the gate electrode thereof is connected with netB(n), the drain electrode thereof is connected with netA(n), and the source electrode thereof is connected with the terminal VSS.

Regarding TFT-D, the gate electrode thereof is connected with netA(n), the drain electrode thereof is connected with the terminal CK, to which the clock signal CK1 is supplied, and the source electrode thereof is connected with the terminal OUT, which is connected with the gate line GLn.

Regarding TFT-E, the gate electrode and the drain electrode thereof are connected with the terminal VDD, and the source electrode thereof is connected with netB(n).

Regarding TFT-F, the gate electrode thereof is connected with the terminal S, the drain electrode thereof is connected with netB(n), and the source electrode thereof is connected with the terminal VSS.

Regarding TFT-G, the gate electrode thereof is connected with netA(n), the drain electrode thereof is connected with netB(n), and the source electrode thereof is connected with the terminal VSS.

Regarding TFT-H, the gate electrode thereof is connected with netB(n), the drain electrode thereof is connected with the terminal OUT, and the source electrode thereof is connected with the terminal VSS.

Regarding TFT-I, the gate electrode thereof is connected with the terminal VTP, to which the signal VTP is supplied, the drain electrode thereof is connected with the terminal OUT, and the source electrode thereof is connected with the terminal VSS.

Regarding the capacitor Ca1, one of electrodes thereof is connected with netA(n), and the other electrode thereof is connected with the terminal OUT.

(Charging Circuit)

Regarding TFT-J, the gate electrode thereof is connected with the terminal S, the drain electrode thereof is connected with the terminal VDD, and the source electrode thereof is connected with netC(n).

Regarding TFT-K, the gate electrode thereof is connected with the terminal CK, to which the clock signal CK1 is supplied, the drain electrode thereof is connected with netC(n), and the source electrode thereof is connected with the terminal VSS.

Regarding TFT-L, the gate electrode thereof is connected with netC(n), the drain electrode thereof is the terminal RESUME, to which the signal RESUME is supplied, and the source electrode thereof is connected with netD(n).

Regarding TFT-M thereof, the gate electrode thereof is connected with netB(n), the drain electrode thereof is connected with netD(n), and the source electrode thereof is connected with the terminal VSS.

Regarding TFT-N, the gate electrode thereof is connected with netB(n), the drain electrode thereof is connected with the terminal VDD, and the source electrode thereof is connected with netA(n). In the present embodiment, TFT-N of the charging circuit 301b(n) has such a configuration that the threshold voltage (Vthn) of TFT-N and the threshold voltage (Vtha) of TFT-A of the selection circuit 301a(n) are approximately equal to each other.

Regarding the capacitor Ca2, one of the electrodes thereof is connected with netC(n), and the other electrode thereof is connected with netD(n).

Next, the following description describes respective operations of the shift register 301n during the image display period TD and the touch position detection period TP.

(Operations During Image Display Period TD)

Figure 7A:
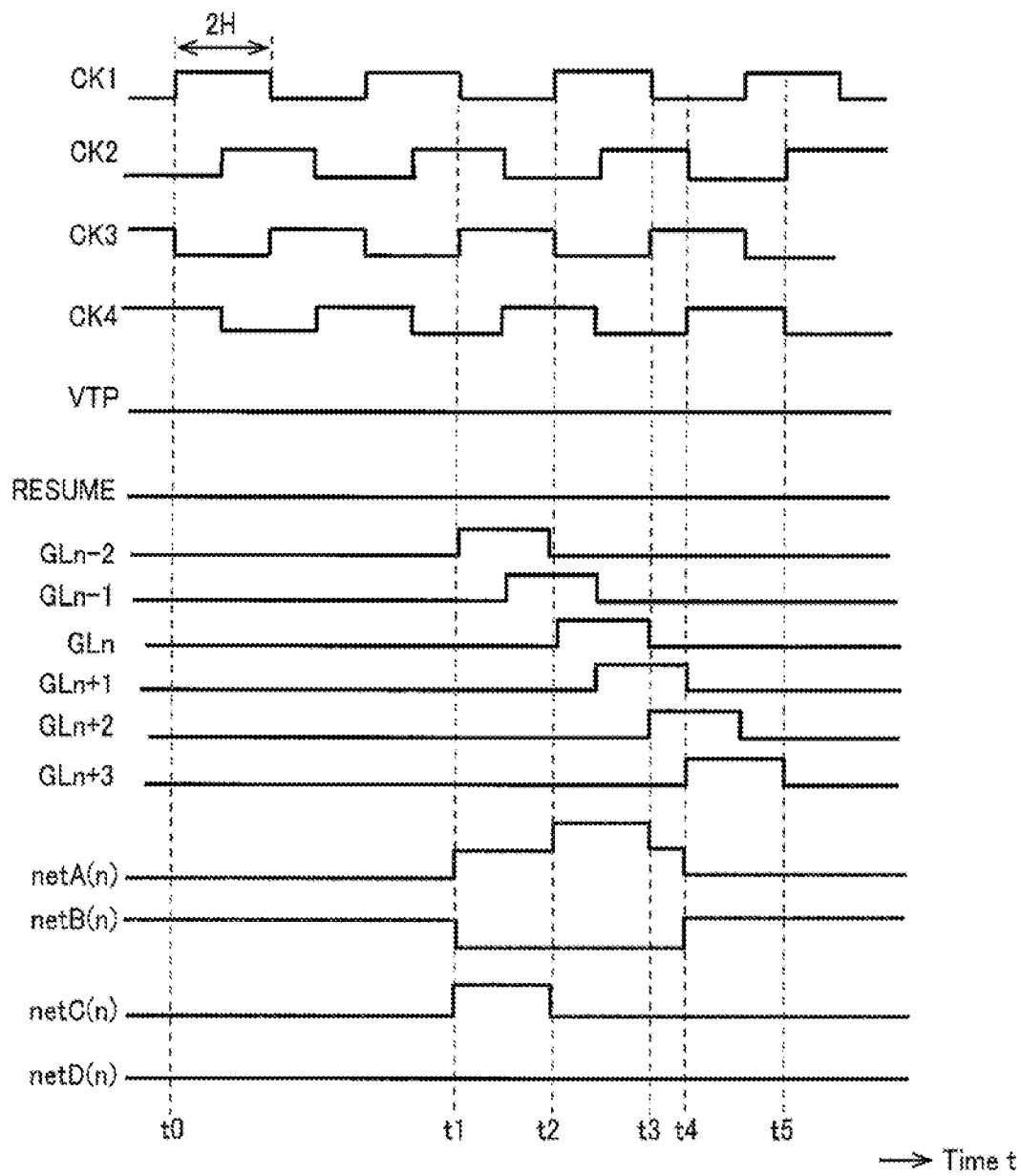
FIG. 7A is a timing chart illustrating operations of the shift register during an image display period TD.

FIG. 7A is a timing chart showing operations of the shift register 301n during the image display period TD.

As illustrated in FIG. 7A, during the image display period TD, the clock signals CK1 to CK4 are supplied from the controller 40 to each shift register. Further, the signal VTP having the potential at the L level and the signal RESUME having the potential at the L level are supplied from the controller 40 to each shift register.

During a period from time t0 to time t1, TFT-K in the charging circuit 301b(n) is turned ON at a timing when the potential of the clock signal CK1 rises to the H level. During this period, the potential of the gate line GLn−2 is at the L level. During this period, therefore, netC(n) keeps the potential at the L level (VSS), and netD(n) also keeps the potential at the L level.

Further, during a period from time t0 to time t1, TFT-A, TFT-B, TFT-F, and TFT-I in the selection circuit 301a(n) are in the OFF state. netA(n) and netB(n), therefore, keep the potentials at the L level.

During a period from time t1 to time t2, the gate line GLn−2 is driven, and the potential of the gate line GLn−2 makes a transition to the H level, which causes TFT-A and TFT-F of the selection circuit 301a(n), and TFT-J of the charging circuit 301b(n), to be turned ON. Further, the potential of the clock signal CK1 makes a transition to the L level, and TFT-K of the charging circuit 301b(n) is turned OFF.

With this, in the selection circuit 301a(n), netA(n) is precharged via TFT-A so as to have a potential of (VDD-Vtha), and netB(n) keeps the potential at the L level. Here, TFT-D is turned ON, although the gate line GLn keeps the potential at the L level since the clock signal CK1 has the potential at the L level.

Further, at this time, in the charging circuit 301b(n), netC(n) has a potential of (VDD-Vthj) via TFT-J. Here, since the signal RESUME has the potential at the L level, netD(n) has the potential at the L level.

During a period from time t2 to time t3, the potential of the clock signal CK1 makes a transition to the H level. This causes the drain electrode of TFT-D of the selection circuit 301a(n) to have the potential at the H level, thereby boosting the potential of netA(n) from (VDD-Vtha) to a further higher potential via the capacitor Ca1 With this, TFT-D and TFT-G are turned ON, netB(n) keeps the potential at the L level, and the selection voltage at the H level (VDD) is applied to the gate line GLn, causing the gate line GLn to be switched to the selected state.

Further, at this time, TFT-K of the charging circuit 301b(n) is turned ON, the potential of netC(n) makes a transition to the L level, and netD(n) keeps the potential at the L level.

During a period time t3 to time t4, the potential of the clock signal CK1 makes a transition to the L level. With this, the potential at the L level is input through TFT-D of the selection circuit 301a(n), netA(n) is caused to have a potential lower than the H level, and the potential of the gate line GLn makes a transition to the L level, whereby the gate line GLn is switched to the non-selected state. At this time, netB(n) keeps the potential at the L level. In the charging circuit 301b(n), TFT-K is turned OFF, and netC(n) and netD(n) keep the potentials at the L level.

During a period from time t4 to time t5, the gate line GLn+3 is switched to the selected state. This causes TFT-B of the selection circuit 301a(n) to be turned ON. At this time, TFT-C, TFT-F, and TFT-G of the selection circuit 301a(n) are turned OFF, although TFT-E is in the ON state. A potential at an H level (VDD-Vthe (Vthe: threshold voltage of TFT-E)), therefore, is input to netB(n) through TFT-E. This causes TFT-C and TFT-H of the selection circuit 301a(n) to be turned ON. The potential at the L level is therefore input to netA(n) and the gate line GLn.

At this time, since TFT-M of the charging circuit 301b(n) is turned ON, netD(n) keeps the potential at the L level.

What is described above is operations of the shift register 301n during the image display period TD. As described above, in the selection circuit 301a(n), TFT-A has a function of precharging netA(n). TFT-B and TFT-C have a function of pulling down the potential of netA(n) to the L level, in the gate line GLn non-selection period (t0 to t1, t4 to t5) except for the gate line GLn precharging period (t1 to t2). Further, TFT-D has a function of applying a selection voltage to the gate line GLn.

On the other hand, in the charging circuit 301b(n), TFT-J has a function of charging netC(n), TFT-K has a function of pulling down the potential of netC(n) to the L level, and TFT-M has a function of pulling down the potential of netD(n) to the L level.

(Operations During Touch Position Detection Period)

Figure 7B:
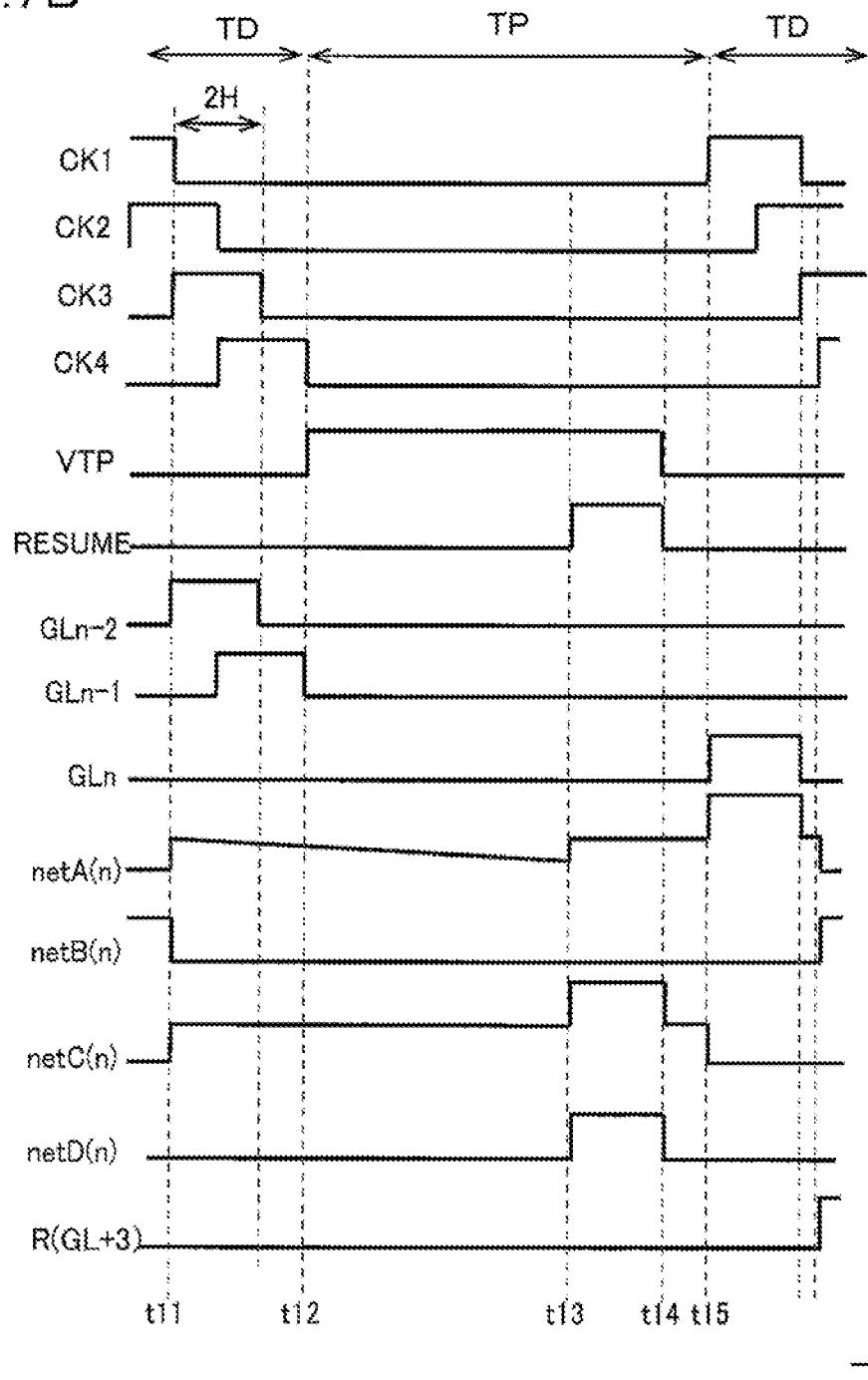
FIG. 7B is a timing chart illustrating operations of the shift register during a touch position detection period TP.

The following description describes operations of the shift register 301n during the touch position detection period TP. FIG. 7B is a timing chart showing operations of the shift register 301n during the touch position detection period TP.

FIG. 7B illustrates the following example: during the image display period TD (t11 to t12), the gate lines are scanned up to the gate line GLn-1, netA(n) of the shift register 301n is precharged, and in this state, the touch position detection period TP (t12 to t15) starts; then, after the touch position detection period TP, again, the image display period TD (t15 and thereafter) starts. The following description mainly describes operations of the shift register 301n during the touch position detection period TP.

As illustrated in FIG. 7B, when the gate line GLn-2 is driven at time t11, TFT-A and TFT-F of the selection circuit 301a(n) are turned ON, the precharging of netA(n) is started, and the potential at the L level is input to netA(n). At this time, TFT-J of the charging circuit 301b(n) is turned ON, and netC(n) is charged so as to have a potential at an H level (VDD-Vthj). At this time, the potential of netD(n) is at the L level.

Thereafter, the gate line GLn-1 is driven, and at time t12, the potential of the signal VTP makes a transition from the L level to the H level, whereby the touch position detection period TP is started. The clock signals CK1 to CK4 are set by the controller 40 so as to have potentials at the L level during the touch position detection period TP, that is, while the signal VTP is at the L level. The clock signals CK1 to CK4 are controlled so as to have the potentials at the L level during the touch position detection period TP in this example, but instead, the outputs of the clock signals CK1 to CK4 may be suspended.

At this time, TFT-I of the selection circuit 301a(n) is in the ON state, and the gate line GLn keeps the potential at the L level. Further, TFT-B and TFT-C of the selection circuit 301a(n) are in the OFF state, but the power source voltage signal VSS is input to the source electrode. Due to leakage current of TFT-B and TFT-C, therefore, the potential of (VDD-Vtha) of netA(n), which is precharged, decreases.

At time t13, which is two horizontal scanning periods before time t14 when the touch position detection period TP ends, the potential of the signal RESUME makes a transition to the H level. This causes the potential at the H level to be input to the drain electrode of TFT-L of the charging circuit 301b(n), thereby, via the capacitor Ca2, causing the potential of netC(n) to be boosted up to a level higher than (VDD-Vthj). At this time, TFT-N is turned ON, and a potential of VDD-Vthn (Vthn: a threshold voltage of TFT-N) is charged into netA(n) via TFT-N. As described above, threshold voltages of TFT-A of the selection circuit 301a(n) and TFT-N of the charging circuit 301b(n) are equal to each other. netA(n) is therefore charged up to the potential of (VDD-Vtha), which is the potential upon precharging.

At time t14, the potential of the signal VTP makes a transition to the L level, the touch position detection period TP ends, and the potential of the signal RESUME also makes a transition to the L level. This causes TFT-I of the selection circuit 301a(n) to be turned OFF. Further, the potential at the L level is input to netC(n) of the charging circuit 301b(n) via TFT-L, whereby the potential of netC(n) is pulled down to (VDD-Vthj).

Thereafter, at time t15, the clock signals CK1 to CK4, which have the potential at the H level and the potential at the L level alternately every two horizontal scanning periods, are supplied by the controller 40, to cause the image display period TD to resume. This causes TFT-K of the charging circuit 301b(n) to be turned ON, thereby causing netC(n) to make a transition to the potential at the L level. Further, the potential at the H level is input to the drain electrode of TFT-D of the selection circuit 301a(n), and via the capacitor Ca1, the potential of netA(n) is boosted up to a level higher than (VDD-Vtha). This causes TFT-D to be turned ON, whereby a selection voltage at the H level is applied to the gate line GLn.

In a case where the charging circuit 301b(n) is not provided, the potential of netA(n) in FIG. 7B decreases during the touch position detection period TP, due to leakage current. When the image display period TD is resumed, therefore, even input of the clock signal CK1 to TFT-D of the selection circuit 301a(n) does not cause the potential of netA(n) to be boosted up to the threshold voltage of TFT-D, and TFT-D remains in the OFF state. Thus, in this case, it is impossible to drive the gate line GLn.

On the other hand, in the above-described embodiment, netC(n) of the charging circuit 301b(n) is charged at the same time as the precharging of netA(n) when the touch position detection period TP starts. In addition, even if leakage current causes the potential of netA(n) to decrease during the touch position detection period TP, netC(n) is charged to the H level by the signal RESUME before the image display period TD is resumed next, and netA(n) is recharged via TFT-N of the charging circuit 301b(n) so that the potential thereof becomes equal to the potential at the precharging. When the image display period TD is resumed, therefore, the potential of netA(n) of the shift register 301n can be boosted up to a level higher than that of the potential of (VDD-Vtha), whereby the gate line GLn can be surely switched to the selected state.

Embodiment 2

Figure 8:
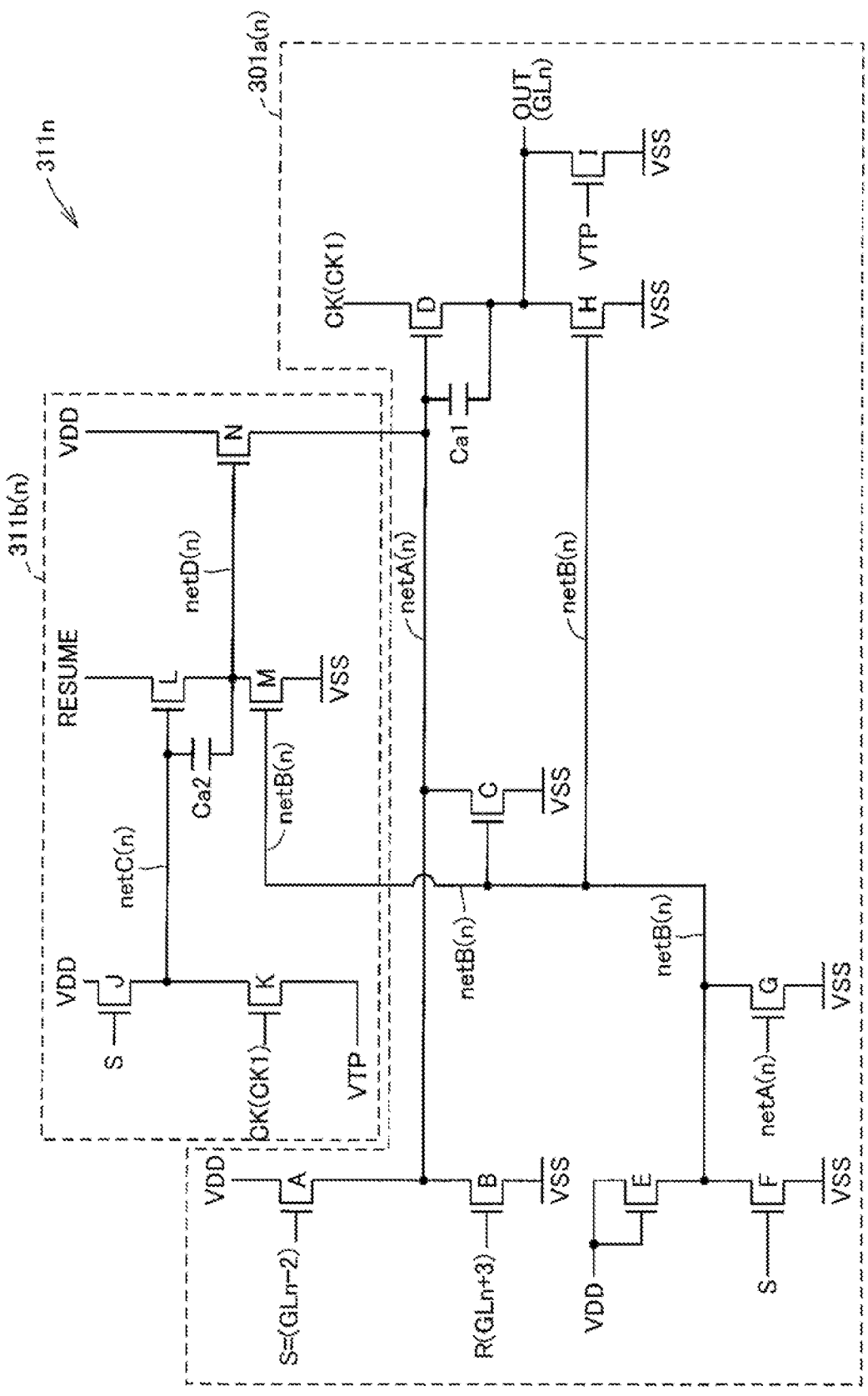
FIG. 8 is an equivalent circuit diagram of a shift register in Embodiment 2.

FIG. 8 is an equivalent circuit diagram of a shift register in the present embodiment. In FIG. 8, constituent members equivalent to those in Embodiment 1 (FIG. 6) are denoted by the same reference symbols as those in Embodiment 1.

A shift register 311n illustrated in FIG. 8 includes a selection circuit 301a(n) identical to that in Embodiment 1, while it includes a charging circuit 311b(n) having a configuration different from that in Embodiment 1. The charging circuit 311b(n) is different from the charging circuit 301b(n) of Embodiment 1 in that the signal VTP is input to the source electrode of TFT-K.

In the case of Embodiment 1, in TFT-K of the charging circuit 301b(n), the power source voltage signal VSS is input to the source electrode thereof, and the potential of netC(n), which is charged during a period from time t11 to time t13 in FIG. 7B, decreases due to leakage current with respect to TFT-K.

On the other hand, in the present embodiment, in TFT-K of the charging circuit 311b(n), the signal VTP is input to the source electrode thereof. During the touch position detection period TP illustrated in FIG. 7B, therefore, the potential of netC(n) is (VDD-Vthj), and the potential of a source end of TFT-K is (VDD). As compared with a case where the power source voltage signal VSS is input to the source electrode of TFT-K, leakage current is suppressed. As a result, the potential reduction at netC(n) is suppressed, whereby a constant potential can be held at netC(n). The present embodiment allows the gate line GLn to be driven more surely as compared with Embodiment 1.

Embodiment 3

Figure 9:
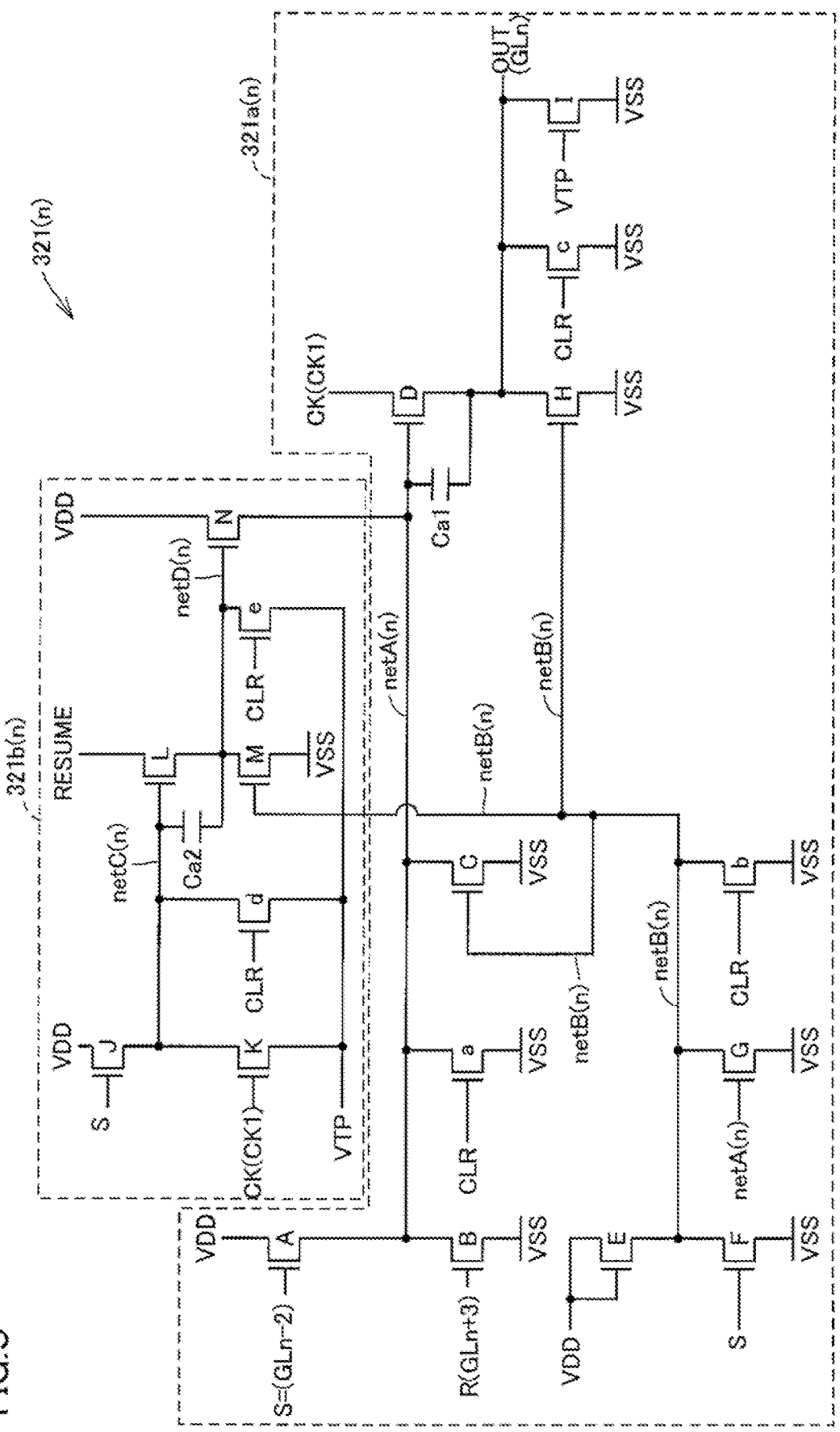
FIG. 9 is an equivalent circuit diagram of a shift register in Embodiment 3.

FIG. 9 is an equivalent circuit diagram of a shift register in the present embodiment. In FIG. 9, constituent members equivalent to those in Embodiment 2 (FIG. 8) are denoted by the same reference symbols as those in Embodiment 2.

A shift register 321n illustrated in FIG. 9 is different from the shift register 311n in Embodiment 2 in that TFTs denoted by a to c (hereinafter referred to as TFTs-a to -c) are added in a selection circuit 321a(n), and TFTs denoted by d and e (hereinafter referred to as TFT-d and TFT-f) are add in a charging circuit 321b(n). In addition, in the present embodiment, as a control signal, a reset signal whose potential rises to the H level every vertical scanning period (hereinafter referred to as signal CLR) is supplied to the shift register 321n for two horizontal scanning periods exclusively, by the controller 40. The shift register 321n has a terminal CLR (not shown) to which the signal CLR is input.

Regarding TFT-a, the gate electrode thereof is connected with the terminal CLR, the drain electrode thereof is connected with netA(n), and the source electrode thereof is connected with the terminal VSS.

Regarding TFT-b, the gate electrode thereof is connected with the terminal CLR, the drain electrode thereof is connected with netA(n), and the source electrode thereof is connected with the terminal VSS.

Regarding TFT-c, the gate electrode thereof is connected with the terminal CLR, the drain electrode thereof is connected with the terminal OUT, and the source electrode is connected with the terminal VSS.

Regarding TFT-d, the gate electrode thereof is connected with the terminal CLR, the drain electrode thereof is connected with netC(n), and the source electrode thereof is connected with the terminal VTP.

Regarding TFT-e, the gate electrode thereof is connected with the terminal CLR, the drain electrode thereof is connected with netD(n), and the source electrode is connected with the terminal VTP.

TFTs-a to -e are turned ON when the signal CLR having the potential at the H level is supplied thereto every vertical scanning period. The potential of netA(n), therefore, is caused to shift to the L level by TFT-a every vertical scanning period, and the potential of netB(n) is caused to shift to the L level by TFT-b every vertical scanning period. The potential of the gate line GLn is caused to shift to the L level by TFT-c every vertical scanning period. Further, the potential of netC(n) is caused to shift to the L level by TFT-d every vertical scanning period, and the potential of netD(n) is caused to shift to the L level by TFT-e every vertical scanning period.

In the present embodiment, the TFTs-a to -e thus provided cause the potentials of netA(n), netB(n), the gate line GLn, netC(n), and netD(n) to shift to the L level every vertical scanning period, respectively. This makes it possible to prevent malfunctions of the shift register 321n from causing the gate line GLn to be driven during a period while the gate line GLn should be in the non-selected state. Besides, since the signal VTP has the potential at the L level during a period except for the touch position detection period TP, leading current of TFTs-K and -d can be reduced during the touch position detection period TP, whereby a constant potential can be held by netC(n).

Embodiment 4

Figure 10A:
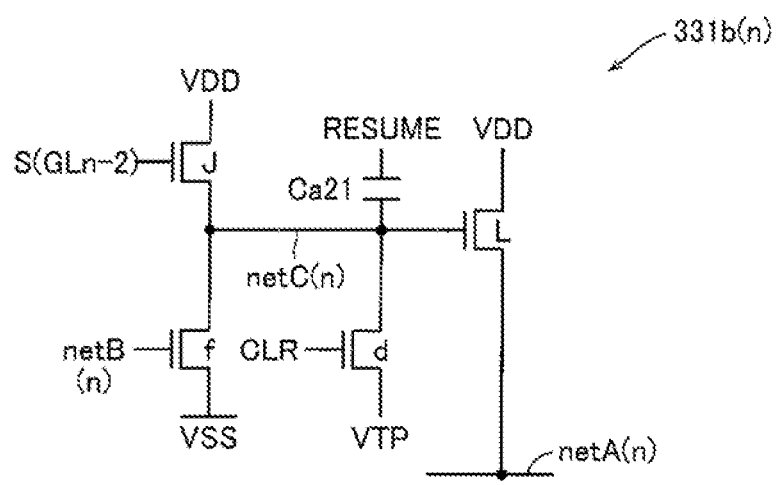
FIG. 10A is an equivalent circuit diagram of a charging circuit in Embodiment 4.

FIG. 10A is an equivalent circuit diagram of a charging circuit in the present embodiment. In FIG. 10A, constituent members identical to those of the charging circuit 321b(n) in Embodiment 3 are denoted by the same reference symbols as those in Embodiment 3. In the present embodiment, the charging circuit illustrated in FIG. 10A is connected to the selection circuit of any one of Embodiments 1 to 3.

The charging circuit 331b(n) illustrated in FIG. 10A has a configuration obtained by adding TFT denoted by "f" (hereinafter referred to as TFT-f) and a capacitor Ca21 to the charging circuit 321b(n) of Embodiment 3, and further, it is different from the charging circuit 321b(n) in that TFT-L, TFT-M, TFT-e, and netD(n) are not provided. The following description describes the configuration of the charging circuit 331b(n), principally about differences from Embodiment 3.

As illustrated in FIG. 10A, the charging circuit 331b(n) has a configuration in which TFT-J, TFT-f, TFT-d, and TFT-L, as well as the capacitor Ca21, are connected to netC(n).

Regarding TFT-f, the gate electrode thereof is connected with netB(n) (see FIG. 9), the drain electrode thereof is connected with netC(n), and the source electrode thereof is connected with the terminal VSS.

Regarding the capacitor Ca21, one of the electrodes thereof is connected with netC(n), the other electrode thereof is connected with the terminal RESUME.

Regarding TFT-N, the gate electrode thereof is connected with netC(n), the drain electrode thereof is connected with the terminal VDD, and the source electrode thereof is connected with netA(n).

Figure 10B:
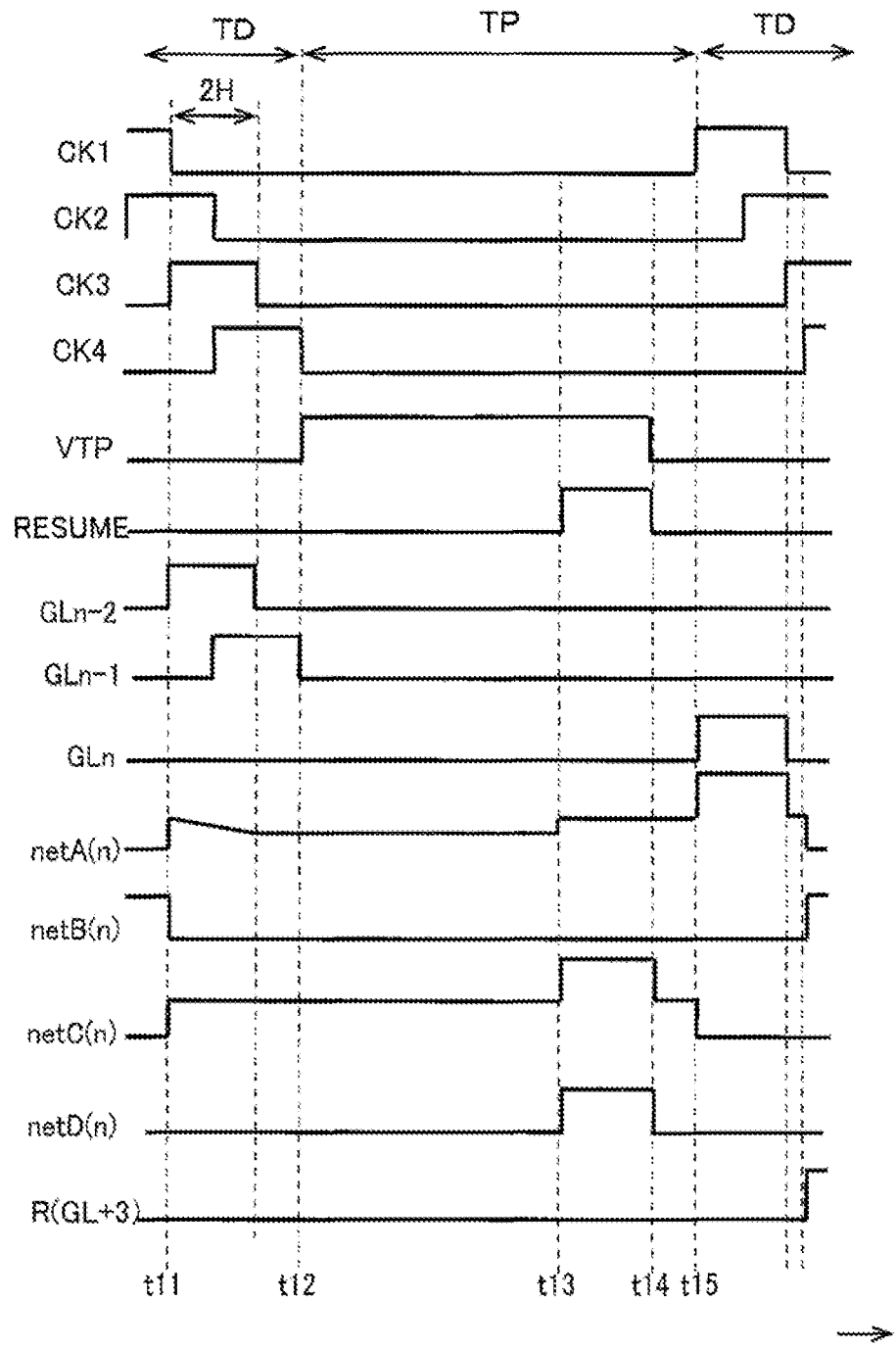
FIG. 10B is a timing chart illustrating operations of a shift register in Embodiment 4.

FIG. 10B is a timing chart illustrating operations of the shift register 331b(n) in the present embodiment. The timing chart illustrated in FIG. 10B is approximately identical to the timing chart of Embodiment 1 illustrated in FIG. 7B, except that the timing of the recharging of netA(n) and the voltage for the recharging are different from those of Embodiment 1.

netC(n) in the charging circuit 331b(n) is charged to the potential of (VDD-Vthj) when the gate line GLn−2 is driven at time t11 (t11 in FIG. 7B), as is the case with the embodiments described above. Regarding TFT-N in the charging circuit 331b(n), the power source voltage signal VDD is supplied to the drain electrode thereof, and when the charging of netC(n) causes TFT-N to shift to the ON state, the potential of (VDD-Vthj-Vthn) is input to netA(n).

Accordingly, When netA(n) is precharged at time t11 and the potential of netA(n) decreases due to leakage current after the start of the touch position detection period TP, netA(n) is charged continuously up to the potential of (VDD-Vthj-Vthn).

Thereafter, before the end of the touch position detection period TP, when the signal RESUME of the potential at the H level is input to the capacitor Ca21 at time t13, netC(n) is boosted by the capacitor Ca21 to a potential higher than (VDD-Vthj). This causes netA(n) to be recharged with the potential of VDD via TFT-N.

Then, when potential of the clock signal CK1 makes a transition to the H level at time t15, the potential at the H level is input to the drain electrode of TFT-D. This causes the potential of netA(n) to be boosted up via the capacitor Ca1 and causes TFT-D to be turned ON, and the selection voltage is applied to the gate line GLn.

In the present embodiment, after the start of the touch position detection period TP, by the time when the signal RESUME whose potential is at the H level is input, netA(n) having a potential decreased due to leakage current can be charged to a certain level. Further, when the signal RESUME whose potential is at the H level is input, netA(n) is recharged to a potential (VDD) higher than that in the cases of the embodiments described above. This makes it possible to switch the gate line GLn into the selected state more quickly as compared with the cases of the embodiments described above. Still further, in the charging circuit 321b(n) in the present embodiment, as compared with the charging circuits of the above-described embodiments, the number of elements composing the charging circuit can be reduced.

Embodiment 5

Figure 11:
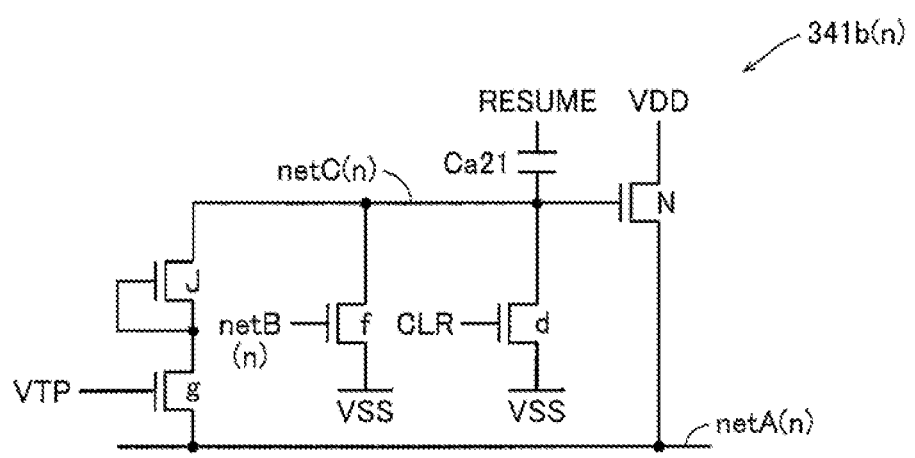
FIG. 11 is an equivalent circuit diagram of a charging circuit in Embodiment 5.

FIG. 11 is an equivalent circuit diagram of a charging circuit in the present embodiment. In FIG. 11, constituent members identical to those of the charging circuit 331b(n) in Embodiment 4 are denoted by the same reference symbols as those in Embodiment 4.

The charging circuit 341b(n) illustrated in FIG. 11 is different from the charging circuit 331b(n) in Embodiment 4 in that TFT denoted by "g" (hereinafter referred to as TFT-g) is added, and is different in the connection among TFT-J, TFT-f, and TFT-d. The following description describes more specifically.

In the charging circuit 341b(n), the gate electrode of TFT-J and the drain electrode of TFT-g are connected with each other, and the drain electrode of TFT-J is connected with netC(n).

Regarding TFT-g, the gate electrode thereof is connected with the terminal VTP, the drain electrode thereof is connected with the gate electrode of TFT-J, and the source electrode thereof is connected with netA(n).

Regarding TFT-f, the gate electrode thereof is connected with netA(n), the drain electrode thereof is connected with netC(n), the source electrode thereof is connected with the terminal VSS.

Regarding TFT-d, the gate electrode thereof is connected with the terminal CLR, the drain electrode thereof is connected with netC(n), and the source electrode thereof is connected with the terminal VSS.

The connection between the capacitor Ca21 and TFT-N is identical to that in Embodiment 4.

Since the respective source electrodes of TFTs-f and -d are connected with the terminal VSS, the potential of netC(n) decreases due to leakage current of TFTs-f and -d during a period after netC(n) is charged and until the signal RESUME whose potential is at the H level is input. During the touch position detection period TR illustrated in FIG. 7B, however, while the signal VTP whose potential is at the H level is being input, TFT-g is turned ON, and netC(n) is connected with netA(n) via TFT-J and TFT-g. Here, the potential of netA(n) decreases due to leakage current to a level lower than (VDD-Vtha), although charges are supplied via TFT-N to netA(n), and charges are supplied from netA(n) to netC(n) via TFTs-J and -g. If the amount of charges supplied from netA(n) to netC(n) is greater than the decrease of the potential of netC(n) due to leakage current, therefore, the potential decrease in netC(n) is reduced, and the supply of charges via TFT-N to netA(n) is continued.

Examples of the display device according to the present invention are as described above. The display device according to the present invention, however, is not limited to the configurations of the above-described embodiments, and may have any one of a variety of modification configurations. The following description describes the modification examples.

(1) The above-described embodiments are described with reference to an example in which the supply of the signal RESUME of the potential at the H level to the shift register 301 is started two horizontal scanning periods before the end of the touch position detection period TR, but the signal RESUME may be supplied before the next image display period TD is resumed. As the charging circuit 301b has a higher charging capacity, the time for charging the selection circuit 301a is shorter. It is therefore only required to input the signal RESUME of the potential at the H level according to the capacity of the charging circuit 301b so that the charging of the selection circuit 301a is completed before the image display period TD is resumed. For example, in a case where the charging circuit 301b has a low capacity, therefore, the supply of the signal RESUME of the potential at the H level may be started two or more horizontal scanning periods before the end of the touch position detection period TP.

(2) In the above-described embodiments, semiconductor layers of TFT 11 for the pixels and TFTs used for the selection circuits 301a and the charging circuits 301b may be formed with amorphous silicon (a-Si), but it is preferable that oxide semiconductor is used.

Examples of the oxide semiconductor includes In (indium) —Ga (gallium) —Zn (zinc) —O (oxygen)-based ternary oxide. The ratio of In, Ga and Zn (composition ratio) is not limited particularly, but may be, for example, In:Ga:Zn=2:2:1, In:Ga:Zn=1:1:1, In:Ga:Zn=1:1:2, or the like. Further, the composition may contain, for example, In, Ga and Zn at a ratio of 1:1:1. TFT that has an In—Ga—Zn—O-based semiconductor layer has a higher mobility (more than 20 times) as compared with TFT formed with a-Si, and has lower leakage current (less than one hundredth) as compared with TFT formed with a-Si. Such TFT is therefore preferably used as TFTs for the selection circuit 301a and the charging circuit 301b in particular. By using TFTs having an In—Ga—Zn—O-based semiconductor layer, leakage current in the shift register 301 can be reduced, and electric power consumption of the display device 1 can be drastically reduced.

Further, the In—Ga—Zn—O-based semiconductor may be amorphous, or may include a crystalline part thereby having crystallinity. As the crystalline In—Ga—Zn—O-based semiconductor, crystalline In—Ga—Zn—O-based semiconductor in which the c-axis is substantially perpendicularly aligned with respect to the layer surface is preferred. The crystal structure of such an In—Ga—Zn—O-based semiconductor is disclosed in, for example, JP-A-2012-134475, the entirety of which is incorporated herein by reference.

The oxide semiconductor layer may contain another oxide semiconductor in place of the In—Ga—Zn—O-based semiconductor. The oxide semiconductor layer may contain, for example, Zn—O-based semiconductor (ZnO), In—Z—O-based semiconductor (IZO (registered trademark)), Zn—Ti—O-based semiconductor (ZTO), Cd—Ge—O-based semiconductor, Cd—Pb—O-based semiconductor, CdO (cadmium oxide), Mg—Zn—O-based semiconductor, In—Sn—Zn—O-based semiconductor (for example, $In_2O_3$—$SnO_2$—ZnO), In—Ga—Sn—O-based semiconductor, or the like.

DESCRIPTION OF REFERENCE NUMERALS

1: display device
2: active matrix substrate
3: counter substrate
4: liquid crystal layer
12: pixel electrode
20: source driver
30: gate driver
40: controller
50: counter electrode (common electrode)
51: signal line
301, 311, 321: shift register
301a, 311a, 321a: selection circuit
301b, 311b, 321b, 331b, 341b: charging circuit
GL: gate line
SL: source line.

The invention claimed is:

1. A display device comprising:
a display panel having a plurality of gate lines; and
driving circuitry that includes a plurality of drive circuits that are provided in correspondence to the gate lines, respectively, so as to scan the gate lines sequentially,
wherein the driving circuitry alternately switches a scanning period in which the gate lines are scanned, and a non-scanning period in which the scanning of the gate lines is suspended, during one vertical scanning period, according to a control signal input to the driving circuitry,
wherein each of the drive circuits includes:
a first switching element that applies a selection voltage to a corresponding one of the gate lines, the selection voltage being a voltage for causing the corresponding gate line to be switched to a selected state;
an internal line connected with a gate electrode of the first switching element;
a second switching element that is connected to the internal line, the second switching element precharging the internal line to a first potential before a start of the non-scanning period; and
a third switching element that includes a drain electrode connected to the internal line, and a source electrode having a second potential that is lower than the first potential, the third switching element pulling down the potential of the internal line to the second potential when the corresponding gate line is in a non-selected state,
wherein one of the plurality of drive circuits corresponding one of the gate lines that is selected at start of the scanning period, includes a charging circuit which recharges the internal line of this drive circuit such that a potential of the internal line rises to at least a potential at the same level as that of the first potential, during a non-scanning period immediately preceding the scanning period.

2. The display device according to claim 1,
wherein the charging circuit charges the internal line to a certain potential lower than the first potential after start of the non-scanning period, and recharges the internal line to a potential higher than the first potential before the start of the scanning period.

3. The display device according claim 1,
wherein the charging circuit includes:
a first charging switching element that is connected with the internal line, and recharges the internal line;
a charging internal line that is connected with a gate electrode of the first charging switching element;
a second charging switching element that charges the charging internal line when the internal line is charged to the first potential; and
a capacitor that is connected to the charging internal line,
wherein the first charging switching element includes a source electrode that is connected with the internal line, a gate electrode that is connected with the charging internal line, and a drain electrode to which a potential equal to or higher than the first potential is supplied, and
when the internal line is recharged by the first charging switching element, the charging internal line is charged, via the capacitor, to a potential higher than that when being charged by the second charging switching element.

4. The display device according to claim 3,
wherein the charging circuit further includes a third charging switching element that is connected with the charging internal line, the capacitor, and the first charging switching element, wherein the first charging switching element is connected with the charging internal line via the capacitor, in the third charging switching element, a gate electrode thereof is connected with the charging internal line, a source electrode thereof is connected with the gate electrode of the first charging switching element and the capacitor, and a potential of a drain electrode thereof is changed to a potential equal to or higher than the first potential before the start of the scanning period, and the capacitor has a pair of electrodes, one of the electrodes is connected with the charging internal line, and the other electrode is connected with the gate electrode of the first charging switching element, and the source electrode of the third charging switching element.

5. The display device according to claim 3, wherein the charging circuit further includes:

a fourth charging switching element that has a source electrode connected to the charging internal line, and a drain electrode whose potential is changed to be equal to higher than the first potential during the non-scanning period.

6. The display device according to claim 3, wherein the capacitor has a pair of electrodes, one of the electrodes is connected with the charging internal line, and before the start of the scanning period, a potential equal to or higher than the first potential is supplied to the other electrode.

7. The display device according to claim 3, wherein the charging circuit further includes:

a fifth charging switching element that is connected to the charging internal line, and pulls down the potential of the charging internal line to the second potential or lower, every vertical scanning period.

8. The display device according to claim 3, wherein the charging circuit further includes:

a fifth charging switching element that is connected to the charging internal line, and pulls down the potential of the charging internal line to the second potential or lower, every vertical scanning period.

9. The display device according to claim 3, wherein a threshold voltage of the first charging switching element, and a threshold voltage of the second switching element, are equal to each other.

10. The display device according to claim 1, wherein the switching element used in the drive circuits and the charging circuit includes oxide semiconductor.

11. The display device according to claim 10, wherein the oxide semiconductor contains indium, gallium, zinc, and oxygen.

12. The display device according to claim 10, wherein the oxide semiconductor includes a crystalline part.

* * * * *